(12) United States Patent
Spirkl

(10) Patent No.: US 10,861,533 B2
(45) Date of Patent: Dec. 8, 2020

(54) APPARATUSES AND METHODS FOR DATA TRANSMISSION OFFSET VALUES IN BURST TRANSMISSIONS

(71) Applicant: MICRON TECHNOLOGY, INC., Boise, ID (US)

(72) Inventor: Wolfgang A. Spirkl, Germering (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/532,017

(22) Filed: Aug. 5, 2019

(65) Prior Publication Data

US 2019/0362773 A1    Nov. 28, 2019

Related U.S. Application Data

(62) Division of application No. 15/692,937, filed on Aug. 31, 2017, now Pat. No. 10,373,674.

(51) Int. Cl.

| | |
|---|---|
| *G11C 11/4096* | (2006.01) |
| *G06F 13/16* | (2006.01) |
| *G11C 11/4093* | (2006.01) |
| *G11C 7/10* | (2006.01) |
| *G11C 11/408* | (2006.01) |

(52) U.S. Cl.
CPC .......... *G11C 11/4096* (2013.01); *G06F 13/16* (2013.01); *G11C 7/1057* (2013.01); *G11C 11/4093* (2013.01); *G11C 11/4087* (2013.01)

(58) Field of Classification Search
CPC ............ G11C 11/4096; G11C 11/4093; G11C 7/1057; G11C 11/4087; G06F 13/16
See application file for complete search history.

(56) References Cited

U.S. PATENT DOCUMENTS

| | | |
|---|---|---|
| 2004/0076192 A1 | 4/2004 | Zerbe et al. |
| 2006/0107154 A1 | 5/2006 | Bansal et al. |
| 2009/0238300 A1 | 9/2009 | Hollis |
| 2010/0105338 A1 | 4/2010 | Wang et al. |
| 2011/0199843 A1* | 8/2011 | Dreps ................. G06F 13/1689 365/193 |

(Continued)

FOREIGN PATENT DOCUMENTS

WO    2019046105 A1    3/2019

OTHER PUBLICATIONS

International Search Report and Written Opinion dated Nov. 28, 2018 for PCT Application No. PCT/US2018/047795, 16 pages.

(Continued)

*Primary Examiner* — Jerome Leboeuf
(74) *Attorney, Agent, or Firm* — Dorsey & Whitney LLP

(57) ABSTRACT

Apparatuses and methods for data transmission offset values in burst transmissions. An example apparatus may include offset logic configured to provide offset values associated with a receiver circuit of a memory device coupled to a signal line. The offset values are based on individual transition threshold voltages biases of sample circuits of the receiver circuit. The example apparatus may further include an input/output (I/O) circuit comprising a driver circuit. The driver circuit configured to receive a logic signal and the offset values and to provide an output signal to the signal line based on the logic signal and to adjust voltages of the output signal based on the offset values.

18 Claims, 9 Drawing Sheets

(56) References Cited

U.S. PATENT DOCUMENTS

| | | |
|---|---|---|
| 2011/0255581 A1 | 10/2011 | Sumesaglam et al. |
| 2013/0241622 A1 | 9/2013 | Lin et al. |
| 2013/0346811 A1 | 12/2013 | Huang et al. |
| 2015/0002408 A1 | 1/2015 | Mozak et al. |
| 2015/0319016 A1 | 11/2015 | Stojanovic et al. |
| 2016/0119169 A1 | 4/2016 | Schober |
| 2018/0277194 A1* | 9/2018 | Hiraishi .............. G11C 11/4076 |

OTHER PUBLICATIONS

PCT Application No. PCT/US18/47795, titled "Apparatuses and Methods for Data Transmission Offset Values in Burst Transmissions" filed on Aug. 23, 2018.

\* cited by examiner

APPARATUSES AND METHODS FOR DATA TRANSMISSION OFFSET VALUES IN BURST TRANSMISSIONS

CROSS-REFERENCE TO RELATED APPLICATIONS

This application is a divisional of U.S. patent application Ser. No. 15/692,937, filed Aug. 31, 2017 and issued as U.S. Pat. No. 10,373,674 on Aug. 6, 2019. These application and patent are incorporated by reference herein in their entirety and for any purposes.

BACKGROUND

Current and future generation DRAM and SDRAM applications utilize very high I/O speeds. This is particularly true in graphics memory, such as current and future generation GDDR5/GDDR5X specifications. Graphics memories are designed for applications requiring high bandwidths and high I/O speeds, for example, in excess of 8 Gbps. However, current and next generation chips, such as GDDR5 for example, employ narrower memory interfaces, such as narrower memory bus widths, and reduced chip size relative to previous generations.

Increasing speeds and smaller footprints generally result in smaller signal amplitude and smaller data valid windows. With smaller data valid windows, small voltage biases inherent in an I/O interface may cause data to be unreliably communicated between a host and a memory.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
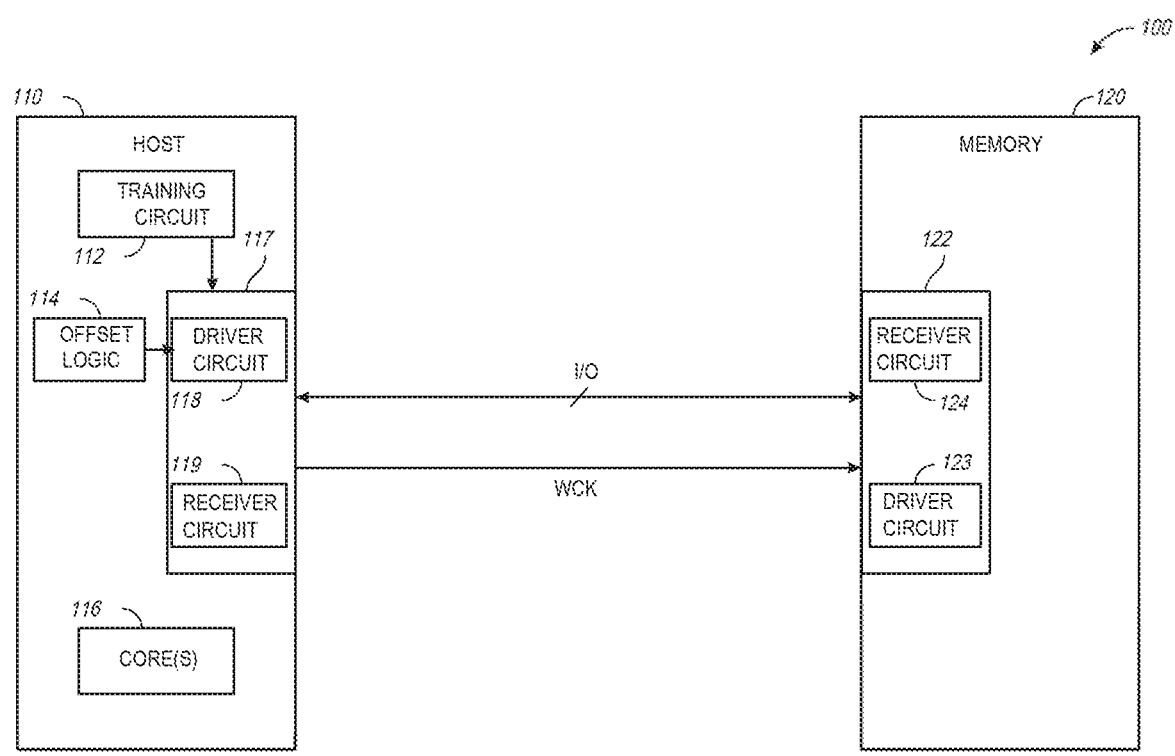
FIG. 1 is a block diagram of a memory system according to an embodiment of the present disclosure.

FIG. 1 is a block diagram of a memory system 100 according to an embodiment of the present disclosure. The system 100 may include a host 110 that communicates with memory device 120 over an input/output (I/O) bus. The host 110 may include any circuit configured to interface with a memory, including a memory controller, a logic chip in a stacked memory device, a processor unit, a graphics processor unit, etc. The host 110 may include a training circuit 112, offset logic 114, core(s) 116, and an I/O interface circuit 117 that includes driver circuit 118 and receiver circuit 119 for communication over the I/O bus. The memory device 120 may include an I/O interface circuit 122. The I/O interface circuit 122 includes a driver circuit 123 and a receiver circuit 124 for communication over the I/O bus. The I/O bus may include one or more data signal lines and one or more write clock (WCK) lines.

In some examples, the host 110 may include a memory controller or processing system and/or the memory device 120 may include a memory, including volatile memory and/or non-volatile memory. In some examples, the memory device 120 may include a dynamic random access memory (DRAM), such as a double-data-rate (DDR) DRAM, a low power DDR DRAM, or a high speed graphic DRAM (e.g., GDDR, GDDR5X, etc.).

The driver circuit 118 may include a respective driver for each signal line to provide signals to the memory device 120 over the I/O bus. The receiver circuit 119 may include a respective receiver for each signal line. Each respective receiver circuit includes a decoder and sample circuit to detect and decode data. The training circuit 112 may perform an interface training operation to determine transition thresholds of sample circuits of receivers of the receiver circuit 124. The training operation may include driving data on signal lines of the I/O bus at various levels via the driver circuit 118, and reading back the data on the signal lines of the I/O bus via the receiver circuit 119 to determine a respective logical transition threshold for each sample circuit (e.g., a voltage where the sampled signal at the receiver circuit 124 transitions from a logical high value to a logical low value, or vice versa). Based on the respective transition thresholds, the core(s) 116 may determine a respective offset value for each sample circuit of the receiver circuit 119, and may store offset values at the offset logic 114 that represent the respective offsets values of the sample circuits. The offset values may indicate a voltage bias in the corresponding sample circuit. The driver circuit 118 may receive the offset values from the offset logic 114, and may adjust (e.g., predistort) levels of the signals transmitted over the I/O bus according to the respective offset value associated with a sample circuit.

The driver circuit 123 of the memory device 120 may include a respective driver for each signal line to provide signals to the host 110 over the I/O bus. Further, the receiver circuit 124 may include a respective receiver for each signal line. Because the drivers of the driver circuit 118 are able to send data at a faster rate than a corresponding receiver can detect data, each receiver of the receiver circuit 119 may include a plurality of sample circuit circuits to sense the data on the signal line during different time periods and further include a decoder circuit to assemble the bits of data to reconstruct a received bitstream. The sample circuits may sense the signal line during different time periods. Each sample circuit may include a comparator circuit, a latch circuit, a decoder logic circuit, or combinations thereof.

In operation, the host 110 and the memory device 120 may communicate over the I/O bus to transfer information, such as data. It will be appreciated, however, that embodiments of the disclosure also include the transfer of other information, such as addresses, commands, etc. between the host 110 and the memory device 120. Thus, embodiments of the disclosure are not limited to only the transfer of data. In some high speed applications, the drivers of the driver circuit 118 may be capable of operating at frequencies greater than single receivers of the receiver circuit 124 are capable of detecting and decoding data. To mitigate a bottleneck that would be caused by conventional receivers, the receivers of the receiver circuit 124 may include a plurality of sample circuits. Each sample circuit may be assigned a different respective time period to detect and decode data on the signal line. That is, each sample circuit may detect a portion of the bitstream transmitted by a respective transmitter of the transmitter circuit 118, and the detected portions may be assembled to reconstruct a received bitstream. For example, if a receiver has four sample circuits A, B, C, and D: sample circuit A may detect a value of the signal line during a first time period from T0 to T1, sample circuit B may detect a value of the signal line during a second time period from T1 to T2, sample circuit C may detect a value of the signal line during a third time period from T2 to T3, sample circuit D may detect a value of the signal line during a fourth time period from T3 to T4, and then the sequence may start over with sample circuit A detecting a value of the signal line during a fifth time period from T4 to T5.

Because of the bus speed, the sample circuits may be sensitive to transition threshold voltage biases when detecting a value of a signal line. The transition threshold voltage biases may be caused by differences in the performance of circuits included in the sample circuits themselves or in reference voltages provided to the sample circuits. To determine whether individual sample circuits of each receiver of the receiver circuit 124 have a voltage bias, the training circuit 112 may perform an interface training operation. The training operation may include driving data on signal lines of the I/O bus at various levels via the driver circuit 118, and reading back the data on the signal lines of the I/O bus to determine a value detected by each sample circuit of the receivers of the receiver circuit 119. Based on the read back data, the training circuit 112 may determine a respective logical transition threshold for each sample circuit (e.g., a voltage where the sampled signal at the sample circuit of the receiver of the receiver circuit 124 transitions from a logical high value to a logical low value, or vice versa). When an actual transition threshold for a sample circuit differs from an expected transition threshold, the core(s) 116 may determine a respective sample circuit offset value for the respective sample circuit of the receiver of the receiver circuit 119 based on a transition voltage bias, and may store the respective sample circuit offset value at the offset logic 114.

In some embodiments, the system 100 may employ decision feedback equalization (DFE) on the I/O bus, where the transition threshold voltages of the receivers are adjusted based on previous values transmitted on a signal like. Generally, in a binary signaling system, the transition voltage is roughly halfway between respective voltages of the two opposite logical values. In some high frequency applications, transition from a voltage corresponding to one logical value (e.g., first bit) to a voltage corresponding to an opposite logical value (e.g., a second bit) may not have enough time to charge or discharge the signal line to a voltage that crosses through the transition threshold voltage, which can cause errors in bit values. To compensate for these transitions, DFE may be employed where the transition threshold voltage is adjusted slightly in one direction based on a value of the previous bit to make crossing the transition threshold voltage slightly more attainable. For example, if a first bit of "1" (e.g., high voltage) followed by a second bit of "0" (e.g., low voltage), the receiver of the receiver circuit 119 may, though various means, adjust the transition threshold voltage to a slightly higher value to detect the second bit. Thus, in addition to an inherent offset in one or more of the sample circuits, the receiver of the receiver circuit 119 may also be changing the transition threshold voltage for DFE. Therefore, in some examples where DFE is employed, the training circuit 112 may send various combinations of bit values to ensure that offsets associated with of the receiver the receiver circuit 119 are selected based on both types of signal transitions. In some examples with a DFE implementation, the offset values may selected based on a value of a previous bit (e.g., first offset value for the second bit if a first bit is a "1" and a second offset value if the first bit is a "0"). In other examples, the offset value is set to a single optimum value based on both types of transitions.

During normal operation, the driver circuit 118 may use the sample circuit offset values retrieved from the offset logic 114 to adjust (e.g., predistort) signal levels of the signals transmitted over the I/O bus when transmitted to a sample circuit having an allocated sample circuit offset value. For example, the driver circuit 118 may determine a voltage to send on the signal line (e.g., to indicate a high logical value or low logical value), and then may adjust that determined voltage based on a corresponding offset value for that given period of time. As previously described, the sample circuits may include a comparator to detect a value of the signal line and a latch to capture the value. The bits of data may be assembled by a decoder also included in the sample circuit to construct a received bitstream.

Communication protocol between the driver circuit 123 and the receiver circuit 119 may be similar to the communication protocol between the driver circuit 118 and the receiver circuit 124. In some examples, a driver of the driver circuit 118 and/or the driver circuit 123 include a multilevel signal driver to drive signals at different voltage levels on a signal line. In some examples, the driver circuit 118 and the driver circuit 123 may each include a DRAM driver. It will be appreciated that the host 110 may be capable of communicating with more than one memory device without departing from the scope of the disclosure.

Figure 2:
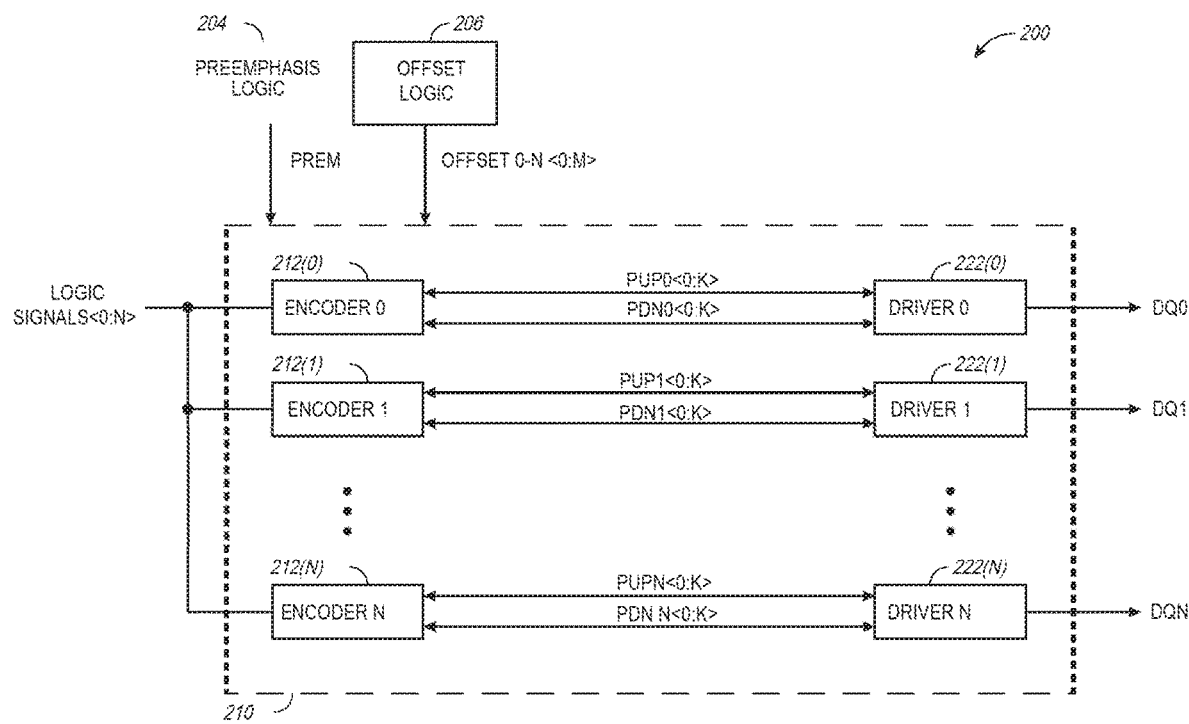
FIG. 2 is a block diagram of a host according to an embodiment of the disclosure.

FIG. 2 is a block diagram of a host 200 according to an embodiment of the disclosure. The host 200 may include offset logic 206, a driver circuit 210 having encoders 0-N, 212(0)-212(N) and drivers 0-N 222(0)-222(N). Each of the encoders 0-N 212(0)-212(N) is coupled to a respective one of the drivers 0-N 222(0)-222(N). In some embodiments of the disclosure, the host 200 may be implemented in the host 110 of FIG. 1, and the driver circuit 210 may be implemented in the driver circuit 118 of FIG. 1. In some examples, the host 200 may include preemphasis logic 204.

The driver circuit 210 may include a respective set of encoders 0-N 212(0)-212(N) and drivers 0-N 222(0)-222(N) for each signal line DQ0-DQN. Each of the encoders 0-N 212(0)-212(N) may receive a respective logic signal <0:N> and offset values 0-N<0:M> from the offset logic 206. Based on the respective logic signal <0:N> and the offset value 0-N<0:M>, each encoder 0-N 212(0)-212(N) may provide a respective pull-up signal PUP0-N<0:K> and a respective pull-down signal PDN0-N<0:K>. That is, the encoders 0-N 212(0)-212(N) may adjust (e.g., pre-distort) voltage levels of the respective logic signals 0-N transmitted over the I/O bus according to the respective offset value 0-N<0:M> associated with a sample circuit on a receiver side (e.g., a sample circuit of a receiver of the receiver circuit 124 of FIG. 1). The offset values 0-N<0:M> provided via the offset logic 206 may be determined as part of an interface training operation, such as the interface training operation performed by the training circuit 112 of FIG. 1 (e.g., sending signals at various voltage levels to determine a transition threshold for each sample circuit. Based on the respective PUP0-N<0:K> signals, and the respective PDN0-N<0:K> signals, the drivers 0-N 222(0)-222(N) drive signals on the signal lines DQ0-DQN. sample circuit In some examples, the preemphasis logic 204 may also apply an additional voltage offset value to a signal line based on other criteria related to a transition of a signal (e.g., a transition from a low value to a high value, or vice versa).

In operation, the host 200 may communicate over signals lines DQ0-DQN to transfer information, such as data. It will be appreciated, however, that embodiments of the disclosure also include the transfer of other information, such as addresses, commands, etc. between the host 200 and a memory device. Thus, embodiments of the disclosure are not limited to only the transfer of data. In some high speed applications, the drivers 0-N 221(0)-221(N) may communicate with receivers that have transition threshold voltage biases, which may affect an ability to accurately detect transmitted data. To compensate for the transition threshold voltage biases on the receiver side, the offset logic 206 may provide individual offset signals to a respective encoder 0-N 212(0)-212(N) of the driver circuit 210 for each sample circuit coupled to a respective signal line DQ0-DQN. Because each sample circuit may be assigned a different respective time period to detect data on the respective signal line DQ0-DQN, the respective encoder 0-N 212(0)-212(N) may apply a corresponding offset value to the signal transmitted during the time period for a particular sample circuit based on the offset value 0-N<0:M> from the offset logic 206. For example, during a first time period from T0 to T1, a first offset value for sample circuit A may be applied to the signal, during a second time period from T1 to T2, a second offset value for sample circuit B may be applied to the signal, during a third time period from T2 to T3, a third offset value for sample circuit C may be applied to the signal, during a fourth time period, from T3 to T4, a fourth offset value for sample circuit D may be applied to the signal, and then the sequence may start over with application of the first offset value for sample circuit A during a fifth time period from T4 to T5.

The offsets applied by the drivers 0-N 222(0)-222(N) to the signal lines DQ0-DQN may be controlled by the respective PUP0-N<0:K> signals and the respective PDN0-N<0:K> signals provided by the encoders 0-N 212(0)-212(N). In some examples, the offset values may be one of a zero offset value, a positive offset value, or a negative offset value. In some examples, the offset values may be based on step sizes that can be accommodated by circuitry of the encoders 0-N 212(0)-212(N) and drivers 0-N 222(0)-222(N). Applying the offset values may improve reliability and robustness in receiving and decoding of bitstreams provided by the host 200.

Figure 3:
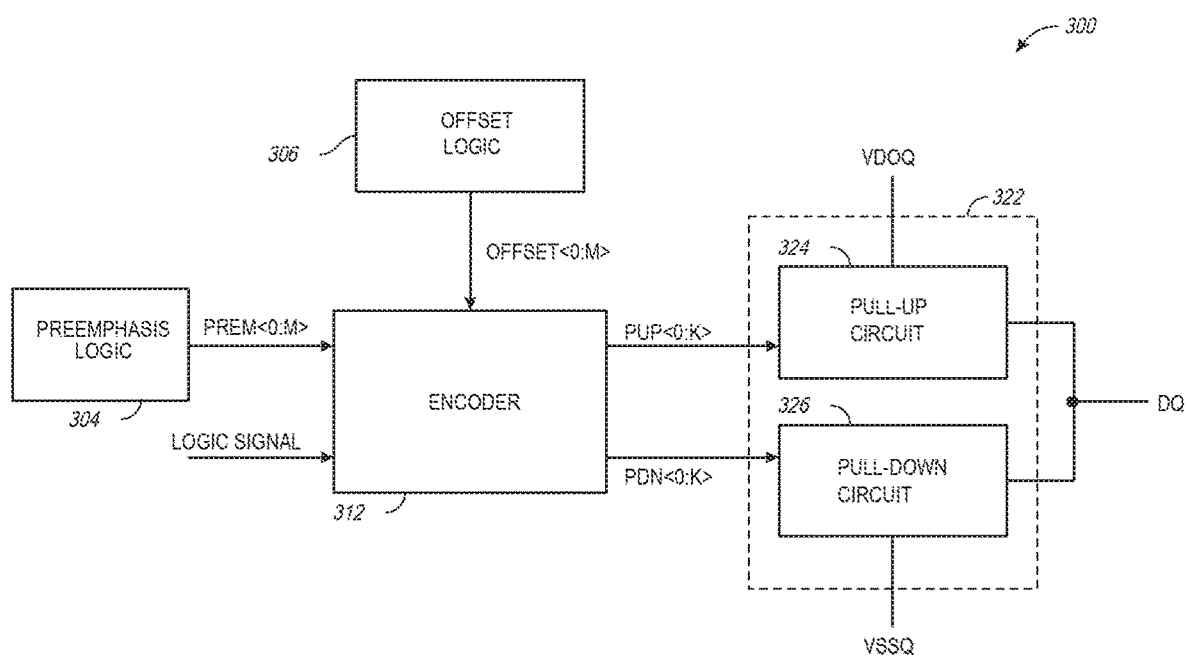
FIG. 3 is a block diagram of a host according to an embodiment of the disclosure.

FIG. 3 is a block diagram of a host 300 according to an embodiment of the disclosure. The host 300 may include offset logic 306, an encoder 312, and a driver 322 having a pull-up circuit 324 and a pull-down circuit 326. In some embodiments of the disclosure, the host 300 may be implemented in the host 110 of FIG. 1 and/or the host 200 of FIG. 2. In some examples, the host 300 may include preemphasis logic 304.

The encoder 312 and the driver 322 may receive a logic signal and provide a corresponding signal over the signal line DQ. The encoder 312 may receive the logic signal and offset values <0:M> from the offset logic 306. Based on the respective logic signal and the offset values <0:M>, the encoder 312 may provide a respective pull-up signal PUP<0:K> to the pull-up circuit 324 and a respective pull-down signal PDN<0:K> to the pull-down circuit 326. Each of the offset values <0:M> may correspond to a respective sample circuit coupled to the signal line DQ. That is, the encoder 312 may adjust voltage levels of the logic signal transmitted over the I/O bus according to the respective offset value associated with a sample circuit on a receiver side (e.g., a sample circuit of a receiver of the receiver circuit 124 of FIG. 1). The offset values <0:M> provided via the offset logic 306 may be determined as part of an interface training operation, such as the interface training operation performed by the training circuit 112 of FIG. 1. Based on the respective PUP<0:K> signals and the respective PDN<0:K> signals, the pull-up circuit 324 and the pull-down circuit 326 may drive signals on the signal line DQ. sample circuit In some examples, the preemphasis logic 304 may also apply an additional voltage offset value to a signal line based on other criteria related to a transition of a signal (e.g., a transition from a low value to a high value, or vice versa).

In operation, the host 300 may communicate over the signals line DQ to transfer information, such as data. It will be appreciated, however, that embodiments of the disclosure also include the transfer of other information, such as addresses, commands, etc. between the host 300 and a memory device. Thus, embodiments of the disclosure are not limited to only the transfer of data. In some high speed applications, the driver 322 may communicate with receivers that have transition threshold voltage biases, which may affect an ability to accurately detect transmitted data. To compensate for the transition threshold voltage biases on the receiver side, the offset logic 306 may provide individual offset values <0:M> to the encoder 312 for each sample circuit coupled to the signal line DQ. Because each sample circuit may be assigned a different respective time period to detect data on the signal line, the encoder 312 may adjust the signal transmitted during the time period for a particular sample circuit based on the offset value <0:M> from the offset logic 306. Thus, the offset values <0:M> may be repeated in a sequential pattern that corresponds to a target sample circuit. For example, during a first time period from T0 to T1, a first offset value <0> for sample circuit A may be applied to the signal, during a second time period from T1 to T2, a second offset value <1> for sample circuit B may be applied to the signal, during a third time period, from T2 to T3, a third offset value <2> for sample circuit C may be applied to the signal, during a fourth time period from T3 to T4, a fourth offset value <3> for sample circuit D may be applied to the signal, and then the sequence may start over with application of the first offset value <0> for sample circuit A during a fifth time period from T4 to T5.

The offset values applied by the driver 322 to the signal line DQ may be controlled by the respective PUP<0:K> signals and the respective PDN<0:K> signals provided by the encoder 312. In some examples, the offsets values <0:M> may have a value indicating one of a zero offset value, a positive offset value, or a negative offset value. In some examples, precision of the offset values <0:M> may be based on step sizes that can be accommodated by circuitry of the encoder 312 and the driver 322. Applying the offset values may improve reliability and robustness in receipt and decoding of bitstreams provided by the host 300.

Figure 4:
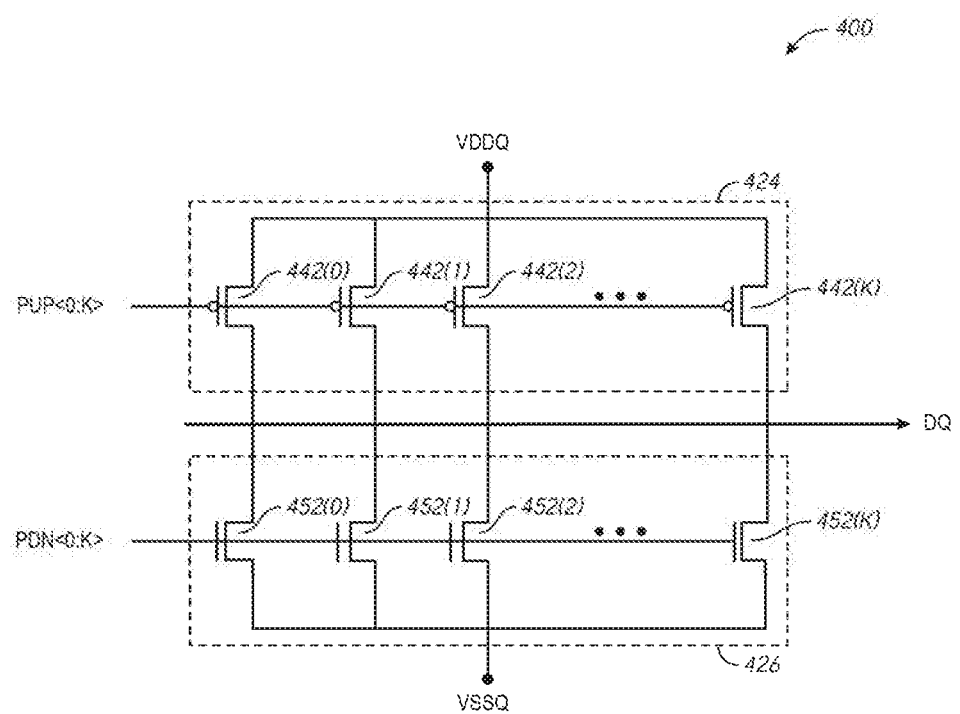
FIG. 4 is a schematic drawing of a driver according to an embodiment of the disclosure.

FIG. 4 is a schematic drawing of a driver 400 according to an embodiment of the disclosure. The driver 400 may be used as a driver in a DRAM, such as a double data rate (DDR) DRAM driver or a GDDR5 DRAM or GDDR5X DRAM driver. While the driver 400 is depicted with at least 4 legs, more or fewer legs may be included without departing from the scope of the disclosure. In this example, the driver 400 may include a pull-up circuit 424 and a pull-down circuit 426. The pull-up circuit includes pull-up signal line drivers (e.g., p-type transistors) 442(0)-442(K). The pull-down circuit 426 includes pull-down signal line drivers (e.g., n-type transistors) 452(0)-452(K). Each pair of a p-type transistor and an n-type transistor may constitute a driver leg. In some examples, the driver 400 may include 7 driver legs. In some embodiments, each of the signal line drivers has an impedance of 240 ohms. The pull-up signal line drivers 442(0)-442(K) may each be controlled by a respective pull-up signal PUP<0:K> to drive the signal line DQ to the VDDQ voltage and pull-down signal line drivers 452(0)-452(K) may each be controlled by a respective pull-down signal PDN<0:K> to drive the signal line DQ to the VSSQ voltage. The driver 400 may be implemented in the driver circuit 118 of FIG. 1, any of the drivers 0-N 222(0)-222(N) of FIG. 2, or the driver 322 of FIG. 3.

In operation, the driver 400 may drive the signal line DQ responsive to the PUP<0:K> signals and the PDN<0:K> signals. The values of the PUP<0:K> signals and the PDN<0:K> signals may be provided by an encoder, such as an encoder 0-N 212(0)-212(N) of FIG. 2 or the encoder 312 of FIG. 3. The values of the PUP<0:K> signals and the PDN<0:K> signals may be set by the encoder based on offset values applied for sample circuits connected to the signal line DQ.

Figure 5:
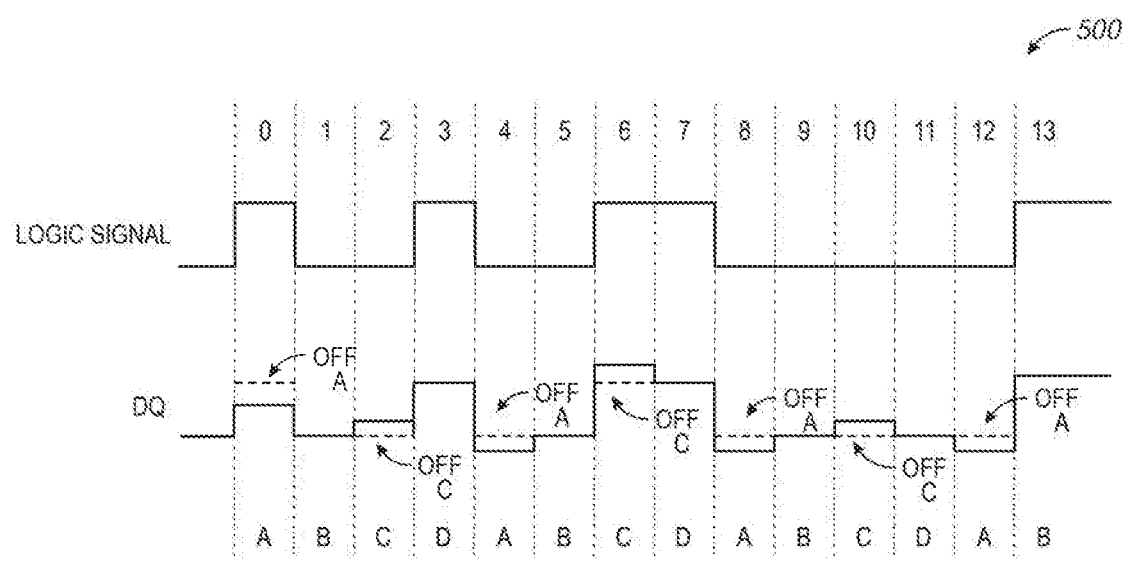
FIG. 5 depicts a timing diagram illustrating operation of an encoder and transmitter pair using the offset values.

FIG. 5 depicts a timing diagram 500 illustrating operation of an encoder and transmitter pair using the offset values. In the timing diagram 500, data slots 0-13 are depicted. Starting with data slot 0, sample circuit A is assigned every fourth data slot (e.g., slots 0, 4, 8, 12); starting with slot 1, sample circuit B is assigned every fourth data slot (e.g., slots 1, 5, 9, 13); starting with slot 2, sample circuit C is assigned every fourth data slot (e.g., slots 2, 6, 10); and starting with slot 3, sample circuit D is assigned every fourth data slot (e.g., slots 4, 8, 11). Based on the logic signal, data slots 0, 3, 6, 7, and 13 are logical high values, and the slots 2, 4, 5, and 8-12 are logical low values.

As shown in the DQ signal, a first offset value is applied to the DQ signal for the data slots 0, 4, 8, and 12 that correspond to sample circuit A and a second offset value is applied the DQ signal for the data slots 2, 6, and 10 that correspond to sample circuit C. The first offset value is a negative offset value (e.g., reduces a value of the DQ signal as compared with no offset value) and the second offset value is a positive offset value (e.g., increases a value of the DQ signal as compared with no offset value). In the example depicted in FIG. 5, the slots associated with sample circuits B and D have no offset value or a zero offset. The offset values may be determined based on a voltage bias inherent in the corresponding sample circuit receiving the data.

It will be appreciated that the first and second offset values are exemplary and not to scale, and any combination of offset value size and relationship may be implemented without departing from the scope of the disclosure. It will be further appreciated that non-zero offset values may be applied to sample circuit B or D slots or non-zero offset values may be applied to sample circuit A or C slots. For example, the first offset value may be larger than the second offset value, equal to the second offset value, or smaller than the second offset value.

Figure 6:
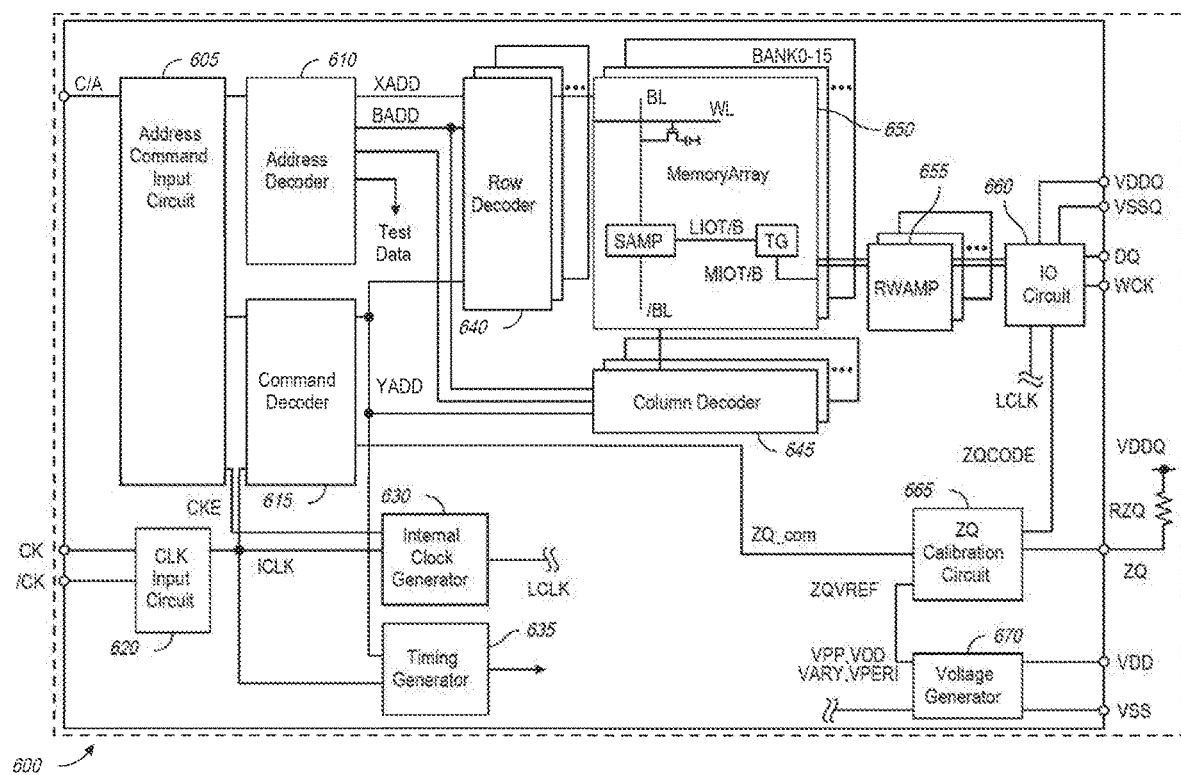
FIG. 6 illustrates a schematic block diagram of a semiconductor device according to an embodiment of the disclosure.

FIG. 6 illustrates a schematic block diagram of a semiconductor device 600 according to an embodiment of the present disclosure. The semiconductor device 600 includes a memory die. The memory die may include an address/command input circuit 605, address decoder 610, command decoder 615, clock input circuit 620, internal clock generator 630, timing generator 635, row decoder 640, column decoder 645, memory arrays 650, read/write amplifiers 655, I/O circuit 660, ZQ calibration circuit 665, and voltage generator 670. The semiconductor device 600 may be implemented in the memory 120 of FIG. 1.

In some embodiments, the semiconductor device 600 may include, without limitation, a DRAM device, such as GDDR5 SGRAM integrated into a single semiconductor chip, for example. The die may be mounted on an external substrate, for example, a memory module substrate, a mother board or the like. The semiconductor device 600 may further include a memory array 650. The memory array 650 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 640 and the selection of the bit line BL is performed by a column decoder 645. Sense amplifiers (SA) are located for their corresponding bit lines BL and connected to at least one respective local I/O line, which is in turn coupled to a respective one of at least two main I/O line pairs, via transfer gates (TG), which function as switches.

The semiconductor device 600 may employ a plurality of external terminals that include address and command terminals coupled to command/address bus (C/A), clock terminals CK and/CK, data terminals DQ, a write clock (WCK) terminal, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the address/command input circuit 605, to an address decoder 610. The address decoder 610 receives the address signal and supplies a decoded row address signal to the row decoder 640, and a decoded column address signal to the column decoder 645. The address decoder 610 also receives the bank address signal and supplies the bank address signal to the row decoder 640, the column decoder 645.

The command/address terminals may further be supplied with a command signal from outside, such as, for example, a memory controller 605. The command signal may be provided, via the C/A bus, to the command decoder 615 via the address/command input circuit 605. The command decoder 615 decodes the command signal to generate various internal commands that include a row command signal to select a word line and a column command signal, such as a read command or a write command, to select a bit line, and a test mode signal. The test mode signal may be provided to a test mode circuit 625, which will be discussed in greater detail below.

Accordingly, when a read command is issued and a row address and a column address are timely supplied with the read command, read data is read from a memory cell in the memory array 650 designated by these row address and column address. The read data DQ is output to outside from the data terminals DQ via read/write amplifiers 655 and an input/output circuit 660. When the write command is issued and a row address and a column address are timely supplied with this command, and then write data is supplied to the data terminals DQ timed responsive to the WCK received via the WCK terminal, the write data is received by data receivers in the input/output circuit 660, and supplied via the input/output circuit 660 and the read/write amplifiers 655 to the memory array 650 and written in the memory cell designated by the row address and the column address.

Turning to the explanation of the external terminals included in the semiconductor device 600, the clock terminals CK and /CK are supplied with an external clock signal and a complementary external clock signal, respectively. The external clock signals (including complementary external clock signal) may be supplied to a clock input circuit 605. The clock input circuit 605 may receive the external clock signals to generate an internal clock signal ICLK. The internal clock signal ICLK is supplied to an internal clock generator 630 and thus a phase controlled internal clock signal LCLK is generated based on the received internal clock signal ICLK and a clock enable signal CKE from the address/command input circuit 605. Although not limited thereto, a DLL circuit can be used as the internal clock generator 630. The phase controlled internal clock signal LCLK is supplied to the input/output circuit 660 and is used as a timing signal for determining an output timing of read data. The internal clock signal ICLK is also supplied to a timing generator 635 and thus various internal clock signals can be generated.

The power supply terminals are supplied with power supply potentials VDD and VSS. These power supply potentials VDD and VSS are supplied to an internal voltage generator circuit 670. The internal voltage generator circuit 670 generates various internal potentials VPP, VOD, VARY, VPERI, and the like and a reference potential ZQVREF based on the power supply potentials VDD and VSS. The internal potential VPP is mainly used in the row decoder 640, the internal potentials VOD and VARY are mainly used in the sense amplifiers included in the memory array 650, and the internal potential VPERI is used in many other circuit blocks. The reference potential ZQVREF is used in the ZQ calibration circuit 665.

The power supply terminals are also supplied with power supply potentials VDDQ and VSSQ. These power supply potentials VDDQ and VSSQ are supplied to the input/output circuit 660. The power supply potentials VDDQ and VSSQ are typically the same potentials as the power supply potentials VDD and VSS, respectively. However, the dedicated power supply potentials VDDQ and VSSQ are used for the input/output circuit 660 so that power supply noise generated by the input/output circuit 660 does not propagate to the other circuit blocks.

The calibration terminal ZQ is connected to the ZQ calibration circuit 665. The ZQ calibration circuit 665 performs a calibration operation with reference to an impedance of RZQ, and the reference potential ZQVREF, when activated by the ZQ calibration command signal (ZQ_com). An impedance code ZQCODE obtained by the calibration operation is supplied to the input/output circuit 660, and thus an impedance of an output buffer (not shown) included in the input/output circuit 660 is specified.

As previously discussed, the command decoder 615 decodes the command signal and generates various internal commands. For example, the command decoder 615 may generate the test mode write internal control signal responsive to a test mode write internal command. When the test mode command is issued, via the command decoder 615, and received by the test mode circuit 625, the test mode circuit may output a test mode control signal, such as a test mode write internal control signal (tm_wrint), to the I/O circuit 660. In response to receiving the test mode write internal control signal, the I/O circuit 660 may be configured to enter a test mode configuration such that data may be written to the memory array 650, and read from the memory array 650, at high speeds without using data receivers of the I/O circuit 660. In other words, test data may be written into the memory array 65 internally, without relying on data receivers, thus allowing write data testing to be performed without input from an external system.

In other examples, the command decoder 615 may perform interface training with a host. During an interface training operation, operation of the I/O circuit 660, along with other components of the semiconductor device 600 may be exercised to determine operation thresholds and limits for interfacing with the host over an I/O bus. For example, offset values for sample circuits of receivers of the I/O circuit 660 may be verified during the interface training operation to allow a host to apply offset values to signals provided to the semiconductor device 600.

Figure 7:
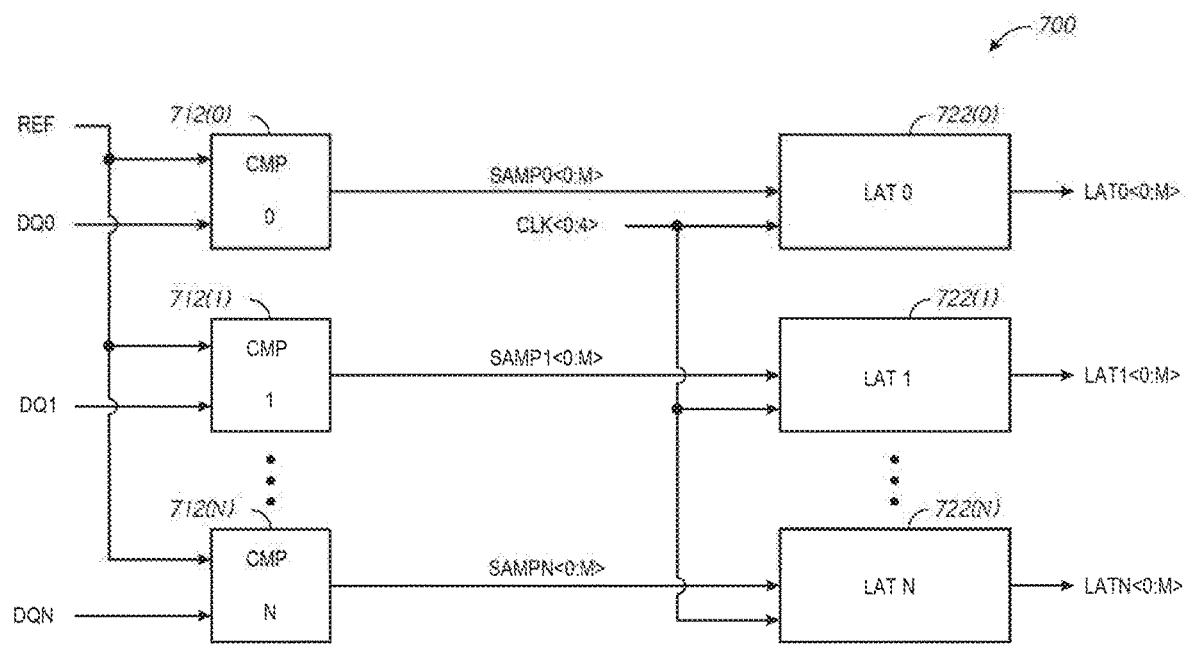
FIG. 7 is a block diagram of a receiver circuit of an I/O circuit of a memory according to an embodiment of the disclosure.

FIG. 7 is a block diagram of a receiver circuit 700 of an I/O circuit of a memory according to an embodiment of the present disclosure. The receiver circuit 700 may include a comparator circuits 0-N 712(0)-712(N) coupled to latch circuits 0-N 722(0)-722(N). The receiver circuit 700 may be implemented in the receiver circuit 124 of FIG. 1 and/or the I/P circuit 660 of FIG. 6.

Each of the comparator circuits 0-N 712(0)-712(N) may be coupled to a corresponding one of the signals lines DQ0-N and may be configured to receive a reference voltage signal REF. Each of the comparator circuits 0-N 712(0)-712(N) may include a plurality of sample circuits configured to compare the voltage of the respective signal line DQ0-N with the REF signal at a respective different period of time and provide sample signals SAMP0-N<0-M> to a respective one of the latch circuits 0-N 722(0)-722(N). The latch circuits 0-N 722(0)-722(N) may provide a respective latch signals LAT0-N<0:M> responsive to clock signals CLK<0:M>. Each of the LAT0-N<0:M> may be provided to a decoder to construct a received bitstream.

Figure 8:
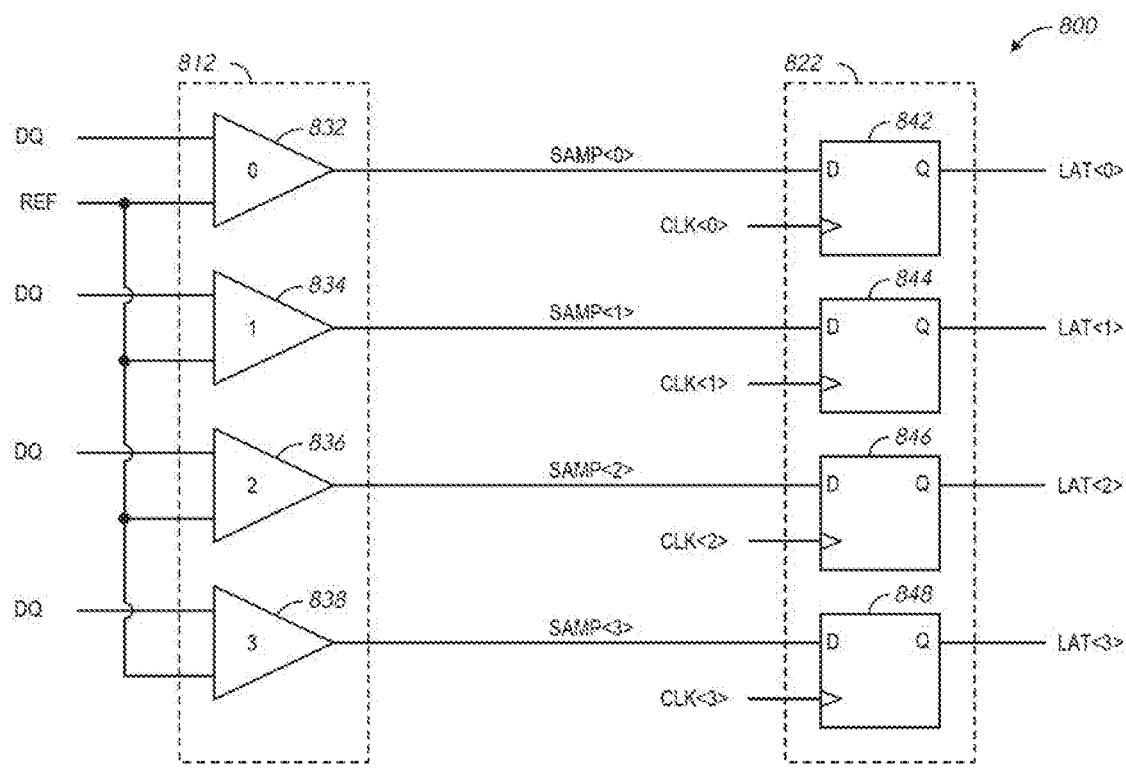
FIG. 8 is a block diagram of a receiver circuit of an I/O circuit of a memory according to an embodiment of the disclosure.

FIG. 8 is a block diagram of a receiver circuit 800 of an I/O circuit of a memory according to an embodiment of the present disclosure. The receiver circuit 800 may include a comparator circuit 812 coupled to a latch circuit 822. The receiver circuit 800 may be implemented in the receiver circuit 124 of FIG. 1, the I/O circuit 660 of FIG. 6, or the receiver circuit 700 of FIG. 7.

The comparator circuit 812 may include comparators 0-3 832, 834, 836, and 838. The sample circuits may include logical comparison circuits, such as differential amplifier circuits, in some examples. Each comparator 0-3 832, 834, 836, and 838 may receive a signal from the DQ signal line, and compare the received signal to a reference signal REF. Based on the comparison, each comparator 0-3 832, 834, 836, and 838 may provide a respective sample signal SAMP<0:3>.

The latch circuit 822 may include latches 0-3 842, 844, 846, and 848. Each latch 0-3 842, 844, 846, and 848 may receive a respective SAMP<0:3> signal and may latch the respective SAMP<0:3> signal as a respective LAI<0:3> in response to the corresponding CLK<0:3> signal. The LAT<0-3> signals may be assembled to recover a bitstream signal provided on the DQ signal line.

Each respective comparator 0-3 832, 834, 836, and 838 and latch 0-3 842, 844, 846, and 848 pair may form a respective sample circuit. In some high speed applications, a single sample circuit per signal line may not be able to reliably detect and decode transitions on the signal line. Thus, dividing the signal line into time periods with the multiple sample circuits may mitigate limitations on detection speed of a single sample circuit. While FIG. 8 shows four sample circuits, it will be appreciated that more or fewer sample circuits may be implemented without departing from the scope of the disclosure. In some DFE applications, a second set of comparators and a second set of latches may be coupled in parallel with the comparators 0-3 832, 834, 836, and 838 and the latches 0-3 842, 844, 846, and 848, with the second set of comparators circuits receiving a second REF voltage and the second set of latches latching the respective outputs of the second set of comparators. For each bit, downstream circuitry may determine whether to use a latched bit from one of the latches 0-3 842, 844, 846, and 848 or from a latch of the second set of latches.

Figure 9:
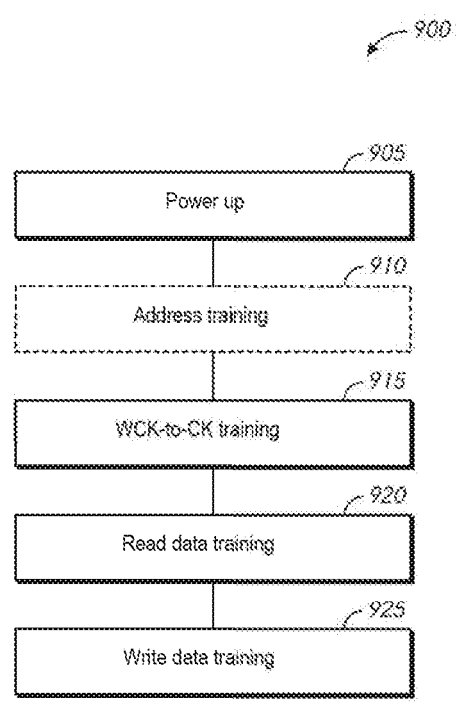
FIG. 9 is a flow diagram of a method for GDDR5 interface training according to an embodiment of the disclosure.

FIG. 9 is a flow diagram of a method 900 for GDDR5 interface training according to an embodiment of the present disclosure. The method 900 may be implemented in the memory system 100 of FIG. 1 or the semiconductor device 600 of FIG. 6. The method 900 begins at block 905, by first powering up. Upon power up, device configuration in ×32 or ×16 mode, and on-die terminations for the address/command lines are set.

At optional block 910, an address training procedure may be completed. Address training may be used to center the address input data eye. In some embodiments, address training mode uses an internal bridge between the device's address input and data outputs. A special READ command is utilized for address capture, which is then synchronously output to the controller via the data output pins, for example, the DQ and DBI_n pins depicted in FIG. 2. The controller may then compare the address patterns to an expected value and adjust address transmit timings accordingly.

At block 915, WCK-to-CK training may be performed. WCK and CK clock signals require a specific phase relationship that varies depending on the device. This phase relationship ensures a reliable phase-over of write data from the external WCK clock domain to the internal CK clock domain. Similarly, the same phase relationship ensures a reliable phase-over of read data, from the internal CK clock domain to the external WCK clock domain, and of the output drivers. This helps to define READ and WRITE latencies between the device and the memory controller. In some embodiments, WCK-to-CK training may be initiated by the controller. The controller may sweep the WCK clocks against the CK clock. The device may respond by a static signal indicating an "early" or "late" clock phase. The optimum phase relationship may be indicated by the transition from early to late phase.

The method 900 continues, at block 920, by performing read training. Read training may enable a controller to find the data eye center and burst frame location for each output from the GDDR5 device. In some embodiments, read training may align the data bus to the WCK clock. This may include two parts: 1) aligning the latching clock in the memory controller to the center of a read data bit; and 2) detecting burst boundaries out of a continuous read data stream. In further embodiments, a read buffer may be utilized to function as temporary storage for read data. The read buffer may be preloaded with test data that may be transmitted over a previous trained address bus. Once read buffer is loaded with test data, a read command may be issued by the controller repeatedly. The controller may then sweep its clock phase until the data is correctly sampled.

At block 925, write training is performed. Write training enables the memory controller to find a data eye center and burst frame location for write data, for each high-speed input of the DRAM. In some embodiments, write training may be the final step in interface training, aligning the data bus to the WCK clock. Analogous to read training, write training ma include two parts: 1) aligning the latching clock in the DRAM to the center of the write data bit; and 2) detecting the burst boundaries of a continuous write data stream. After write training, all data eyes are expected to be centered. The read and write training may also allow a host to determine whether to apply an offset value for sample circuits within the GDDR5 device.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a memory comprising a receiver circuit having a first sample circuit and a second sample circuit, wherein the first sample circuit is configured to receive a signal via a signal line and detect a value of the signal at first data slots, wherein the second sample circuit is configured to receive the signal via the signal line and detect the value of the signal at second data slots that are different than the first data slots, wherein the signal on the signal line is predistorted by a transmitter based on a first offset value for the first data slots and is predistorted by the transmitter based on a second offset value for the second data slots, wherein the first offset value is based on a first fixed voltage offset value of the first sample circuit, and wherein the second offset value is based on a second fixed voltage offset value of the second sample circuit.

2. The apparatus of claim 1, wherein the first sample circuit comprises a first comparator configured to compare the signal to a reference signal and to provide a first sample signal based on the comparison, wherein the first sample circuit further comprises a first latch configured to latch the first sample signal in response to a first clock signal.

3. The apparatus of claim 2, wherein the second sample circuit comprises a second comparator configured to compare the signal to the reference signal and to provide a second sample signal based on the comparison, wherein the second sample circuit further comprises a second latch configured to latch the second sample signal in response to a second clock signal that is not aligned with the first clock signal.

4. The apparatus of claim 1, wherein a first data slot of the second data slots is adjacent a first data slot of the first data slots.

5. The apparatus of claim 1, wherein one of the first offset value or the second offset value is a negative offset value and the other of the first offset value or the second offset value is a positive offset value.

6. The apparatus of claim 1, wherein the first offset value is different than the second offset value.

7. The apparatus of claim 1, wherein the receiver circuit further comprises a decoder configured to decode data provided on the signal based on the value of the signal at the first data slots detected by the first sample circuit and the value of the signal at the second data slots detected by the second sample circuit.

8. The apparatus of claim 1, the receiver circuit further includes:
a third sample circuit configured to receive the signal via the signal line and detect the value of the signal at third data slots that are different than the first and second data slots; and a fourth sample circuit is configured to receive the signal via the signal line and to detect the value of the signal at fourth data slots that are different than the first, second, and third data slots.

9. The apparatus of claim 8, wherein the signal on the signal line is predistorted based on a third offset value for the third data slots and is predistorted based on a fourth offset value for the fourth data slots.

10. A method, comprising:
detecting, at a first sample circuit of a receiver circuit of a memory, a value of a signal via a signal line at first data slots, wherein the signal on the signal line is predistorted by a transmitter based on a first offset value for the first data slots, wherein the first offset value is based on a first fixed voltage offset value of the first sample circuit; and
detecting, at a second sample circuit of the receiver circuit of the memory, the value of the signal via the signal line at second data slots that are different than the first data slots, wherein the signal on the signal line is predistorted by the transmitter based on a second offset value for the second data slots, wherein the second offset value is based on a second fixed voltage offset value of the second sample circuit.

11. The method of claim 10, wherein detecting the value of the signal via the signal line at the first data slots at the first sample circuit comprises:
comparing the signal to a reference signal to provide a first sample sigmal; and
latching the first sample signal in response to a first clock signal.

12. The method of claim 11, wherein detecting the value of the signal via the signal line at the second data slots at the second sample circuit comprises:
comparing the signal to a reference signal to provide a second sample signal; and
latching the second sample signal in response to a second clock signal that is not aligned with the first clock signal.

13. The method of claim 10, wherein a first data slot of the second data slots is adjacent a first data slot of the first data slots.

14. The method of claim 10, wherein one of the first offset value or the second offset value is a negative offset value and the other of the first offset value or the second offset value is a positive offset value.

15. The method of claim 10, wherein the first offset value is different than the second offset value.

16. The method of claim 10, further comprising decoding data provided on the signal based on the value of the signal at the first data slots detected by the first sample circuit and the value of the signal at the second data slots detected by the second sample circuit.

17. The method of claim 10, the receiver circuit further includes:
detecting, at a third sample circuit of the receiver circuit, the value of the signal at third data slots that are different than the first and second data slots; and
detecting, at a fourth sample circuit of the receiver circuit, the value of the signal at fourth data slots that are different than the first, second, and third data slots.

18. The method of claim 17, wherein the signal on the signal line is predistorted based on a third offset value for the third data slots and is predistorted based on a fourth offset value for the fourth data slots.

\* \* \* \* \*